United States Patent
Wei et al.

(10) Patent No.: US 7,636,077 B2
(45) Date of Patent: Dec. 22, 2009

(54) BACKUP SHIFT REGISTER MODULE FOR A GATELINE DRIVING CIRCUIT

(75) Inventors: Chun-Ching Wei, Taipei (TW); Yang-En Wu, Hsinchu (TW); Wei-Cheng Lin, Wurih Township, Taichung County (TW)

(73) Assignee: AU Optronics Corporation, Hsinchu (TW)

( * ) Notice: Subject to any disclaimer, the term of this patent is extended or adjusted under 35 U.S.C. 154(b) by 728 days.

(21) Appl. No.: 11/302,917

(22) Filed: Dec. 13, 2005

(65) Prior Publication Data
US 2007/0085809 A1    Apr. 19, 2007

Related U.S. Application Data

(60) Provisional application No. 60/727,885, filed on Oct. 18, 2005.

(51) Int. Cl.
*G09G 3/36* (2006.01)
(52) U.S. Cl. ............... 345/100; 345/55; 345/92; 345/93; 345/94; 345/99
(58) Field of Classification Search ........... 345/100, 345/55, 92–94, 99
See application file for complete search history.

(56) References Cited

U.S. PATENT DOCUMENTS

| | | | |
|---|---|---|---|
| 5,410,583 A | 4/1995 | Weisbrod et al. | 377/75 |
| 5,434,899 A | 7/1995 | Huq et al. | 377/78 |
| 5,926,156 A * | 7/1999 | Katoh et al. | 345/55 |
| 6,426,743 B1 | 7/2002 | Yeo et al. | 345/213 |
| 6,467,057 B1 | 10/2002 | Wang et al. | 714/726 |
| 6,556,646 B1 | 4/2003 | Yeo et al. | 377/54 |
| 6,690,347 B2 | 2/2004 | Jeon et al. | 345/100 |
| 6,747,627 B1 | 6/2004 | Koyama et al. | 345/100 |
| 6,845,140 B2 | 1/2005 | Moon et al. | 377/78 |
| 7,245,690 B2 * | 7/2007 | Mutaguchi | 377/64 |
| 2004/0189585 A1 | 9/2004 | Moon | 345/100 |
| 2005/0104647 A1 | 5/2005 | Choi et al. | 327/333 |

FOREIGN PATENT DOCUMENTS

| | | |
|---|---|---|
| EP | 0651395 | 5/1995 |
| WO | WO 02/065062 | 8/2002 |

* cited by examiner

*Primary Examiner*—Richard Hjerpe
*Assistant Examiner*—Leonid Shapiro
(74) *Attorney, Agent, or Firm*—Ware, Fressola, Van Der Sluys & Adolphson, LLP (57) ABSTRACT

A backup shift register module having at least two backup shift registers is used to repair a defective main shift-register module. A normally open link is provided between the input of first backup shift register and the input of each odd-numbered main shift register, and between the output of first backup shift register and the input of each even-numbered main shift register. A normally open link is provided between the input of second backup shift register and the input of each even-numbered main shift register, and between the output of second backup shift register and the input of each odd-numbered main shift register. If one main shift register is defective, the input and output of the defective shift register are disconnected from the cascade link, and the normally open links are connected to the input of the defective shift register and the output of the next shift register are connected.

14 Claims, 7 Drawing Sheets

Fig. 7

BACKUP SHIFT REGISTER MODULE FOR A GATELINE DRIVING CIRCUIT

The present invention is based on and claims priority to U.S. Provisional Patent Application No. 60/727,885, filed Oct. 18, 2005.

FIELD OF THE INVENTION

The present invention pertains to flat panel liquid crystal display (LCD) panels and, more specifically, to a gateline driver for a LCD panel.

BACKGROUND OF THE INVENTION

Figure 1:
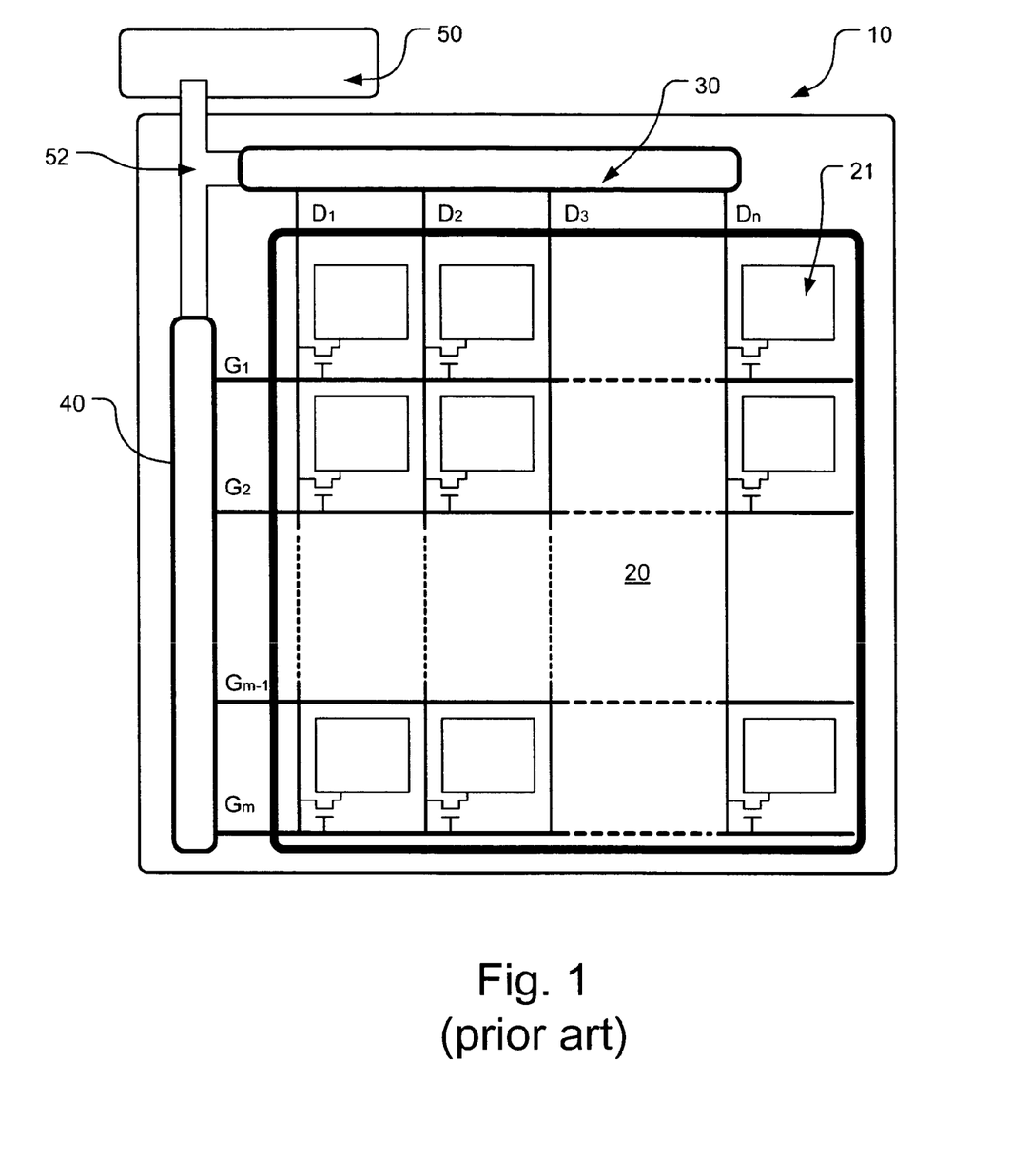
FIG. 1 is a block diagram of a typical TFT-LCD display device.

Thin-film transistor liquid-crystal display (TFT-LCD) panels are known in the art. As shown in FIG. 1, a typical TFT-LCD display panel 10 comprises a display module 20 having a plurality of pixels 21 arranged in a two-dimensional array. These pixels are controlled by a plurality of data lines D1, D2, . . . , Dn and a plurality of gate lines G1, G2, . . . , Gm. The data lines are connected to a data source driver 30 and the gate lines are connected to a gate-line driver 40. A printed circuit board (PCB) 50 containing circuits necessary to convert image data into voltage signals is connected to drivers 30 and 40 via a control bus 52.

In recent years, amorphous silicon gate drivers (ASGDs), which are integrated circuits (ICs) directly fabricated on the same substrate that supports the pixel array, are replacing silicon-chip gate driver ICs for gate-line driving of the LCD display. The ASGD technology allows for fewer external components, thus reducing the cost of manufacturing.

Figure 2:
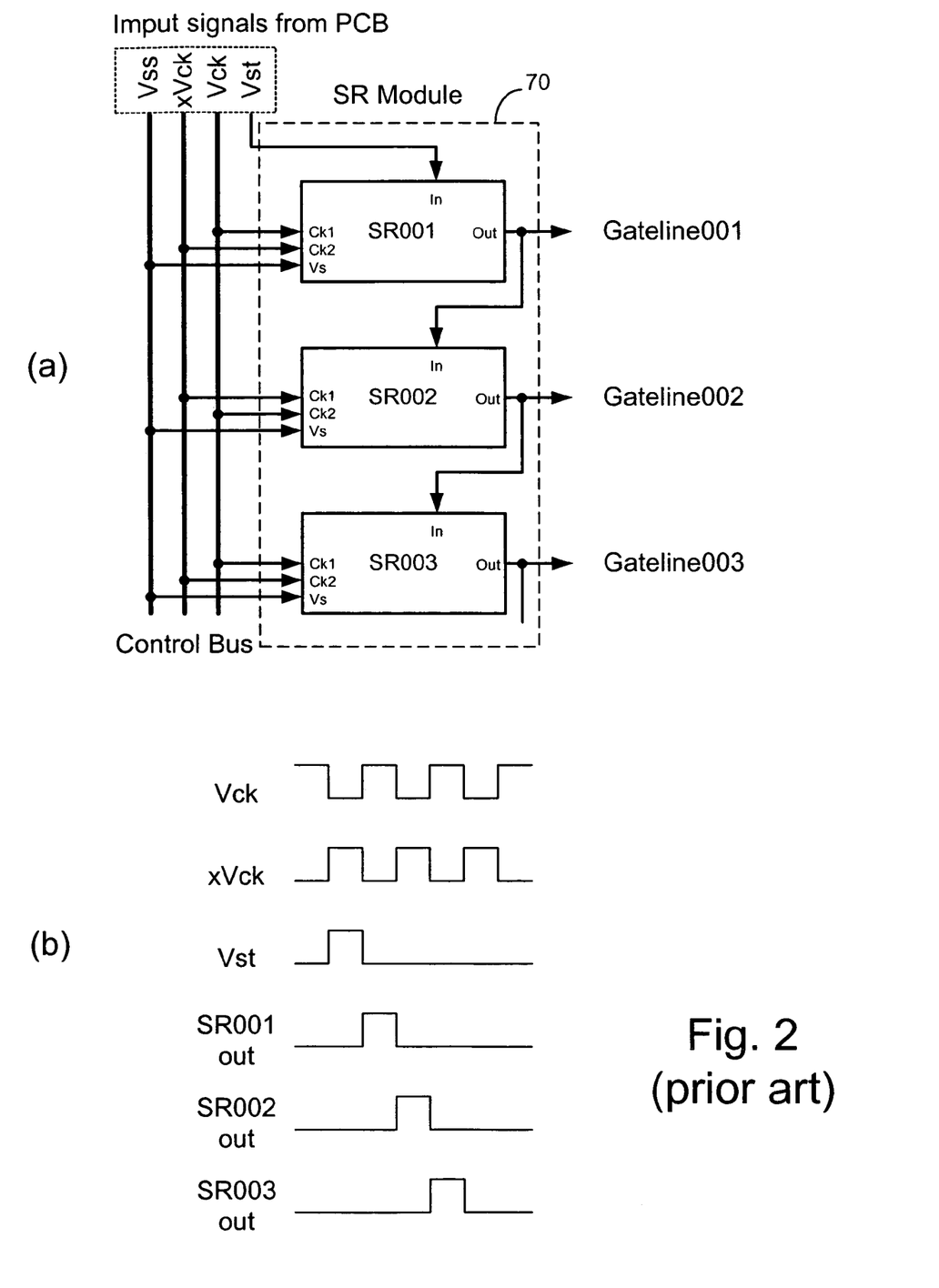
FIG. 2(a) is a schematic drawing of shift registers in a prior art gateline driving circuit.
FIG. 2(b) shows signal waveforms of Vck, xVck, Vst and shift register outputs.

As shown in FIG. 2(a), an exemplary ASGD gate-line driving circuit contains a shift register module 70 that has a plurality of shift registers. Each shift register (SR) has an input terminal (In), an output terminal (Out), a voltage source terminal (Vs), a first clock signal terminal (Ck1) and a second clock signal terminal (Ck2). Signals coming from the control bus 52 (see FIG. 1) for gate-line driving include a negative voltage Vss, a start pulse signal Vst, a clock signal Vck and an inverted clock signal xVck. The inverted clock signal xVck has a phase 180° behind the phase of the clock signal Vck. Vss is applied to the voltage source terminal (Vs) of every SR. Vst is applied to the input terminal of the first SR in the SR module. Vck and xVck are applied to clock terminals Ck1 and Ck2, respectively, of each SR in an alternate fashion so that every odd-numbered SR is connected as Vck→Ck1 and xVck→Ck2, and every even-numbered SR is connected as Vck→Ck2 and xVck→Ck1. The output terminal of a SR connects to a gate line of the LCD array. Each gateline connects to one row of pixels.

The SRs in the shift register module 70 are connected in a cascade manner. When a pulse Vst indicating the beginning of a frame arrives at the first shift register SR001, SR001 provides an output pulse to the first gate line, Gateline001, in response to a clock signal Vck. The same output pulse is also provided to the input terminal of the second shift register SR002. In response to the inverted clock signal xVck, the second shift register SR002 provides an output pulse to the second gate line, Gateline002. The output pulse from SR002 is also provided to the input terminal of the third shift register SR003 so that an output pulse from SR003 is provided to the third gate-line, Gateline003, in response to the clock signal Vck. In this manner, every gate line receives a positive voltage pulse in sequence. The odd-numbered SRs are operated in synchronization with the clock signal Vck, whereas the even-numbered SRs are operated in synchronization with the inverted clock signal xVck. A time sequence of Vck, xVck, Vst and SR outputs is shown in FIG. 2(b).

Since SRs are connected in a cascade manner, one defective or failed SR would effectively disable all of the subsequent SRs in the shift register module 70. For that reason, a defective SR must be replaced whenever it occurs. However, since the gate driver is fabricated on the same substrate that supports the display pixel array, replacing one SR would mean discarding the entire display panel altogether. This is very cost ineffective.

Thus, it is advantageous and desirable to provide a method and device for repairing the shift register module while other components of the display panel are preserved.

SUMMARY OF THE INVENTION

The present invention provides a method for repairing a main shift register module by providing a backup shift register thereto. The main shift register module has a plurality of odd-numbered shift registers and a plurality of even-numbered shift registers connected in a cascade link. The backup SR module is fabricated on the same substrate that supports the main shift register module. The backup shift register module contains at least a first backup shift register and a second backup shift register. A normally open connectable link is provided between the input of the first backup shift register and the input of each odd-numbered shift register, and between the output of the first backup shift register and the input of each even-numbered of the main shift register module. Likewise, a normally open connectable link is provided between the input of the second backup shift register and the input of each even-numbered shift register, and between the output of the second backup shift register and the input of each odd-numbered shift register of the main shift register module. If one odd-numbered shift register in the main shift register module is defective, the input and output of the defective shift register are disconnected from the cascade link. At the same time, the link between the input of the defective shift register and input of the first backup register is connected and the link between the input of the subsequent even-numbered shift register and the output of the first backup register is connected. Likewise, if one even-numbered shift register in the main shift register module is defective, the input and output of the detective shift register are disconnected from the cascade link. At the same time, the link between the input of the defective shift register and input of the second backup register is connected and the link between the input of the subsequent odd-numbered shift register and the output of the second backup register is connected.

BRIEF DESCRIPTION OF THE DRAWINGS

The above and other objects, features and advantages of the invention will become apparent from a consideration of the subsequent detailed description presented in connection with accompanying drawings, in which.

DETAILED DESCRIPTION OF THE INVENTION

The present invention can be achieved in numerous ways, particularly through the following exemplary embodiments.

First Embodiment of the Invention

Figure 3:
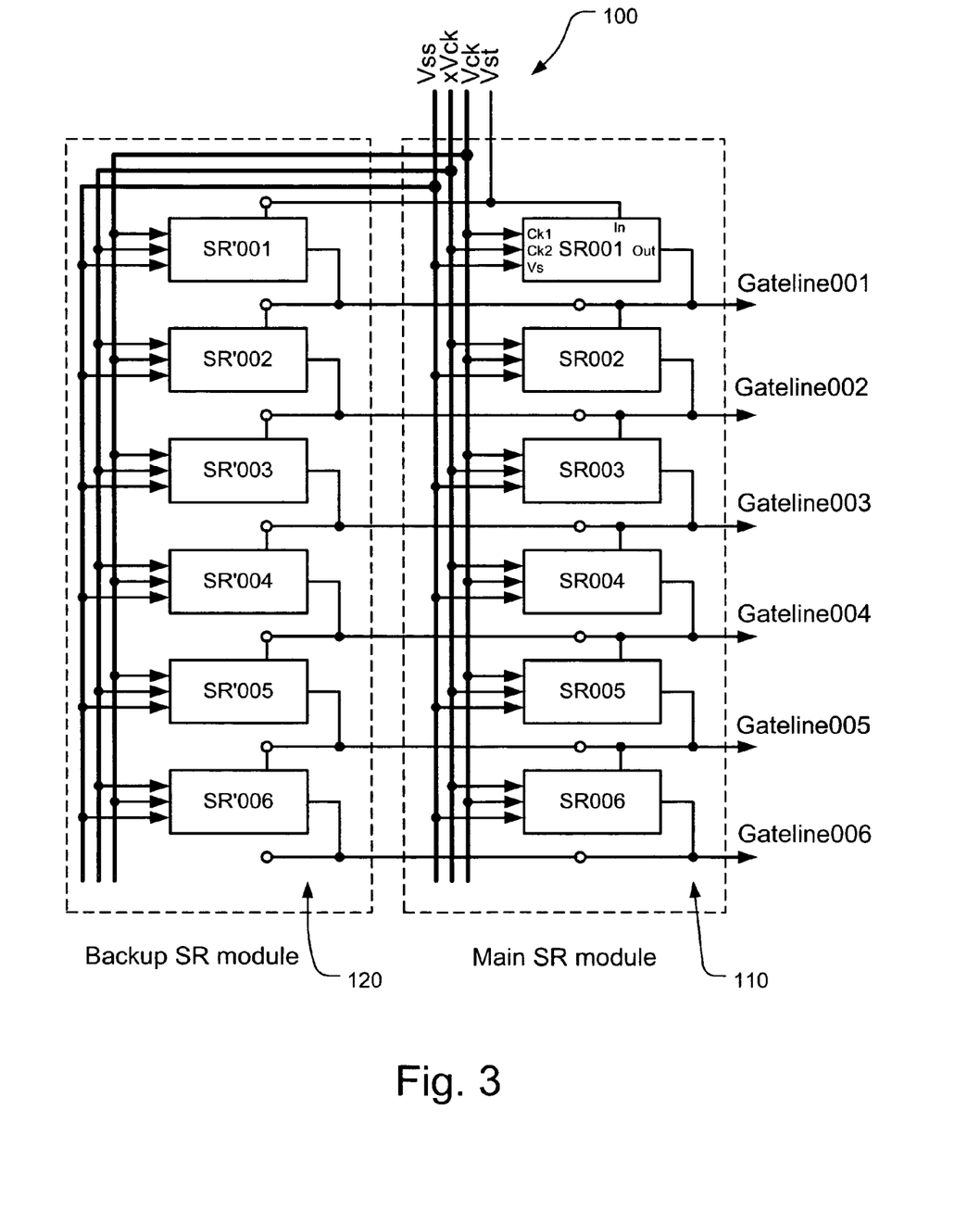
FIG. 3 is a circuit diagram showing a backup SR module and a main SR module, according to a first embodiment of the invention.

The circuit diagram of the first embodiment of the invention is shown in FIG. 3. A gate-line driver 100 comprises a main shift register module 110 and a backup shift register module 120. The backup shift register module 120 is constructed substantially in parallel to the main shift register module 110, and it contains the same number of shift registers (SRs) as that of the main shift register module 110. The SRs in the backup module 120 are arranged in a cascade manner such that the output of a backup SR is connected to a subsequent backup SR by a normally open link. The SRs in the main module 110 are also connected in a cascade manner such that the output of a SR is electrically connected to the input of the subsequent SR. Control signals from the control bus run through both main module and the backup module in parallel. A Vst signal line is connected to input of the first SR in the main module 110.

The interconnection between the backup module 120 and the main module 110 is such that the input of each backup SR is connected to the input of the corresponding SR in the main module by a normally open link.

In normal operation, there is no output from any of the backup SRs, because the connection links between the backup SRs and the SRs in the main module are all open, as indicated by open circles.

If the main SR module is functioning properly, the backup SR module does not perform any function. However, if one or more of the SRs in the main SR module become defective, the defective SRs can be bypassed and replaced with a corresponding backup SRs in the backup module. This is accomplished by connecting the defective SRs to the corresponding backup SRs.

Figure 4:
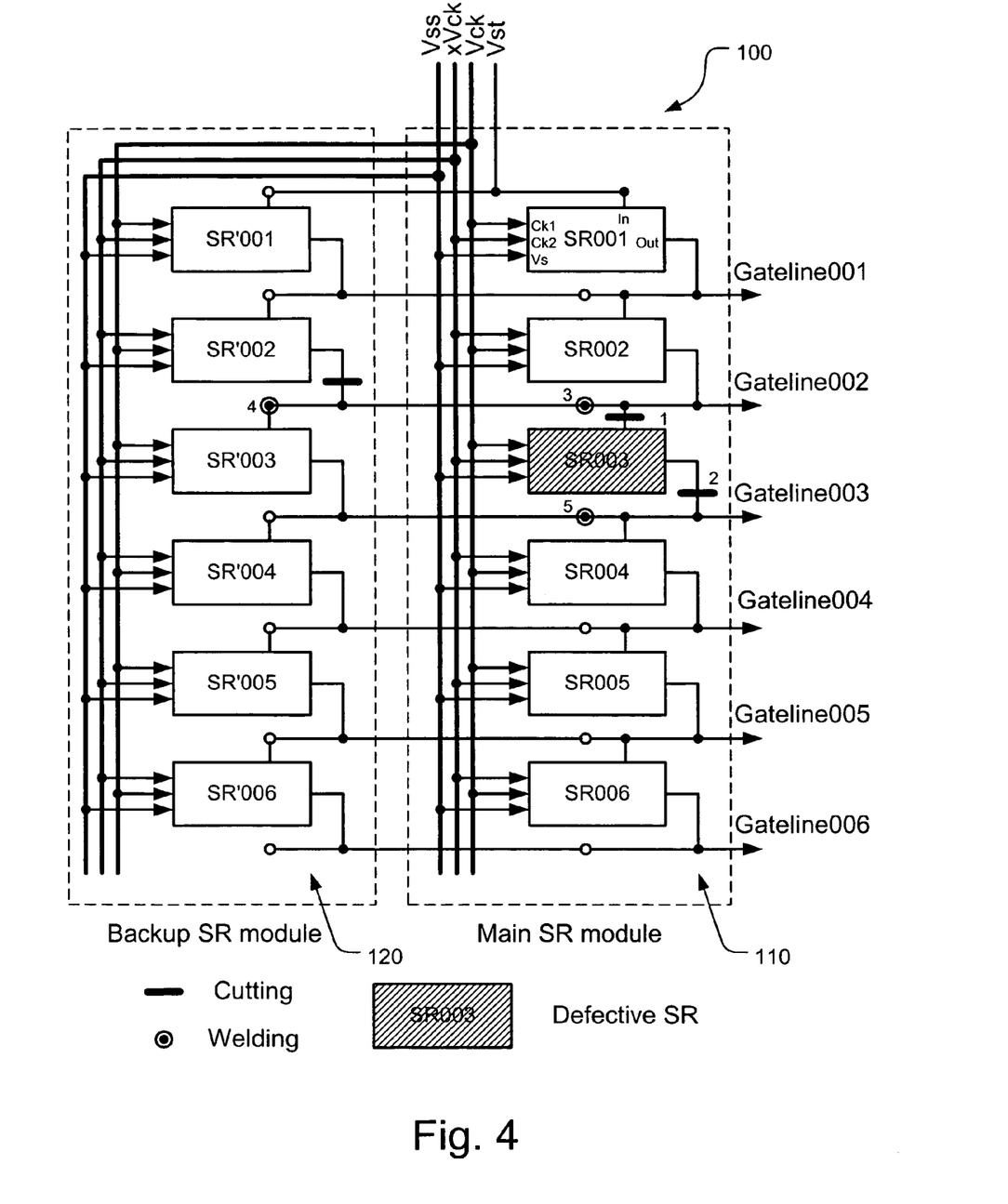
FIG. 4 is a circuit diagram showing a backup SR module and a main SR module, in which one defective SR in main SR module is replaced by one SR in the backup SR module, according to the first embodiment of the invention.

As shown in FIG. 4, for example, a third SR, SR003, in the main SR module 110 is defective. The input and the output of the SR003 are disconnected from the cascade link at points 1 and 2, respectively, by cutting. Meanwhile, the output of the preceding SR, SR002, in the main module 110 is connected to the input of the backup SR corresponding to the defective SR003 by electrically connecting points 3 and 4. Furthermore, the output signal of that backup SR is connected to the subsequent SR, SR004, of the main module 110 by electrically connecting point 5. Electrically connecting points 3, 4 and 5 separately can be achieved by welding, or by a similar method. At the same time, the linkage between correspond backup SR and its preceding backup SR is severed by cutting, for example. By such cutting and welding, a defective SR in the main module is replaced by a corresponding backup SR. The number of the detective SRs in the main module replaceable can be one, two or more. In fact, all of the SRs in the main module 110 can be separately replaced by the corresponding backup modules.

Second Embodiment of the Invention

Figure 5:
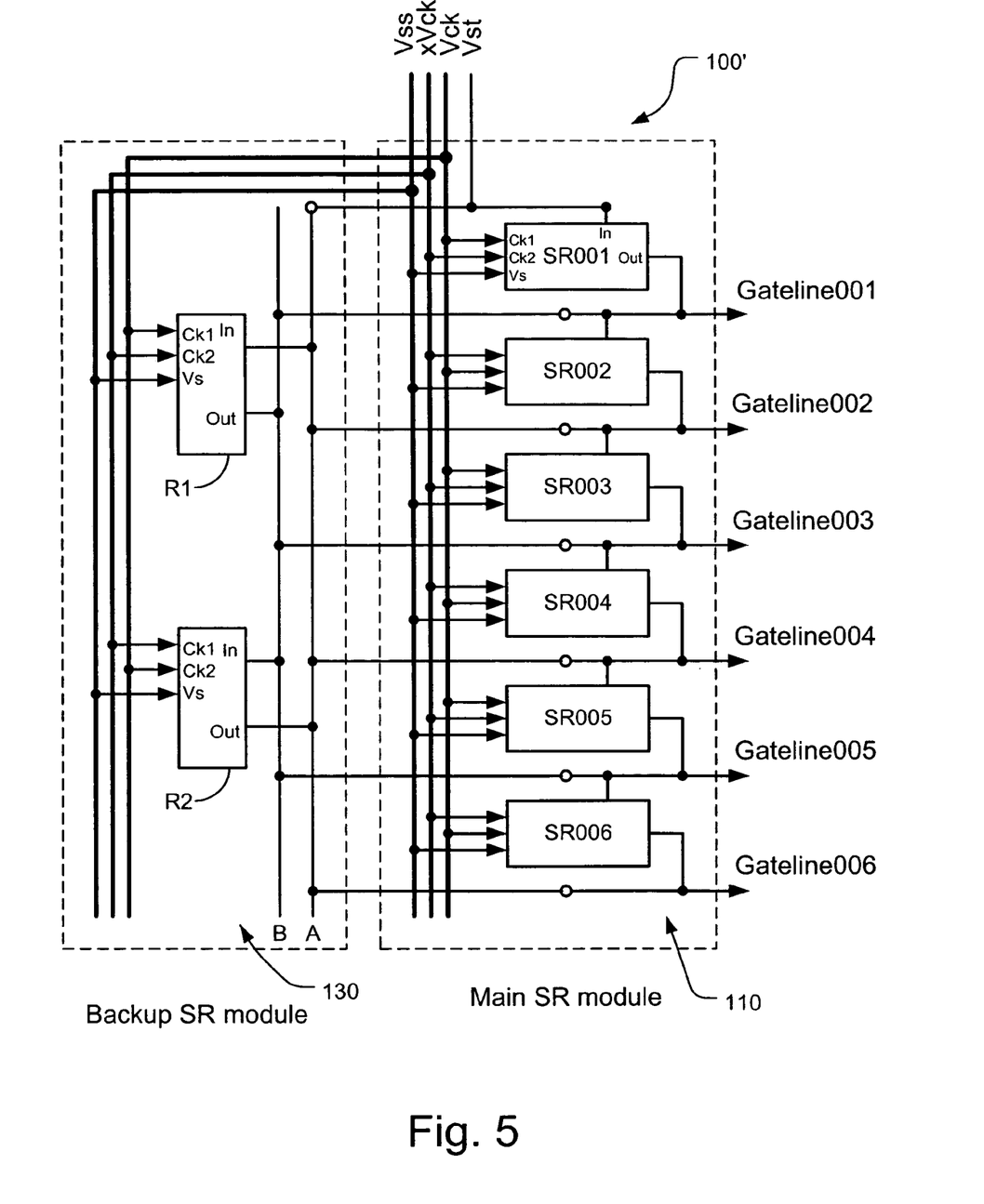
FIG. 5 is a circuit diagram showing a backup SR module and a main SR module, according to a second embodiment of the invention.

The circuit diagram of the second embodiment of the invention is shown, as an example, in FIG. 5. A gate-line driver 100' comprises a main shift register module 110 and a backup shift register module 130. The backup shift register module 130 contains fewer SRs than the main shift register module. As such, the backup module 130 occupies less space on the substrate than the main module 110. A smaller backup module helps to minimize the total footprint of an LCD display panel.

In the example of FIG. 5, two backup SRs, R1 and R2, are used as backup to six SRs in the main SR module 110. The SRs in the main module and the backup SRs, R1 and R2, are connected to the control bus in parallel. However, the clock signal Vck is provided to Ck2 of R2 and Ck1 of R1 and all odd-numbered SRs in the main module 110, while the clock signal xVck is provided to Ck1 of R2 and Ck2 of R1 and all even-numbered SRs in the main module 110.

As shown in FIG. 5, two local bus lines, A and B, are arranged in the backup SR module. The input of R1 and the output of R2 are connected to bus line A, and the output of R1 and the input of R2 are connected to bus line B. As such, a defective odd-numbered SR in the main module is replaced by R1 and a defective even-numbered SR in the main module is replaced by R2. However, only one defective SR in the main module 110 can be replaced. Furthermore, there is a normally open link provided between bus line A and the input of each odd-numbered SR in the main module, and there is a normally open link provided between bus line B and the input of all even-numbered SR in the main module.

In normal operation, there is no electrical linkage between the backup module and the main module because the connection links are normally open, as indicated by open circles. However, if one of the SRs in the main module becomes defective, the defective SR can be bypassed and replaced with a backup SR.

Figure 6:
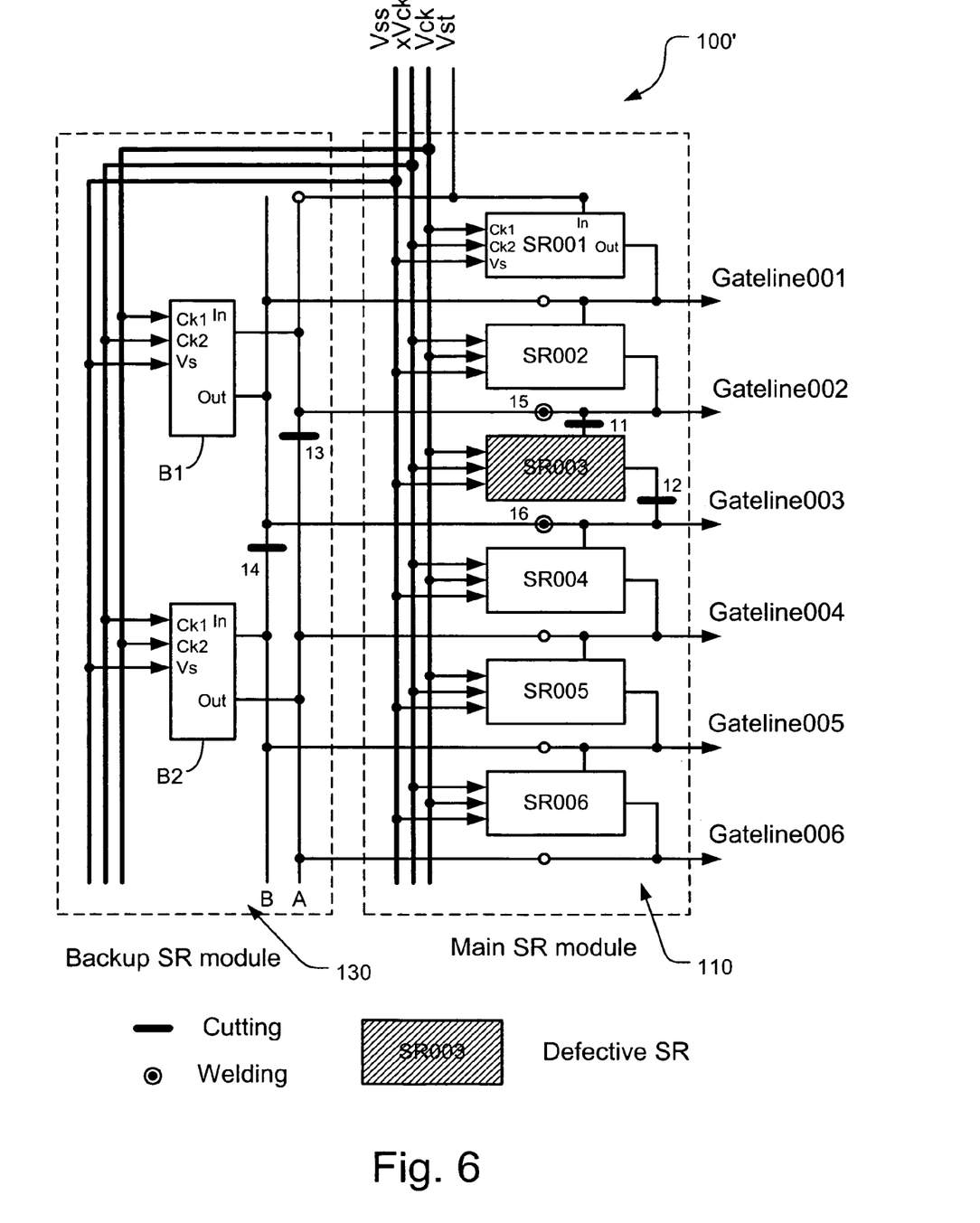
FIG. 6 is a circuit diagram showing a backup SR module and a main SR module, in which one odd-numbered defective SR in main SR module is replaced by one SR in the backup SR module, according to the second embodiment of the invention.

If the defective SR is an odd-numbered SR such as the third SR, SR003, as shown in FIG. 6, the input and the output of SR003 are disconnected from the cascade link by cutting at points 11 and 12, respectively. Meanwhile, the output of the preceding SR, SR002, is electrically connected to the input of R1 via bus line A, and input of the subsequent SR, SR004, is electrically connected to output of the R1 via bus line B. The electrical connections can be made by welding at points 15 and 16. Furthermore, the linkage between R1 and R2 is severed by cutting bus lines A and B at points 13 and 14.

Figure 7:
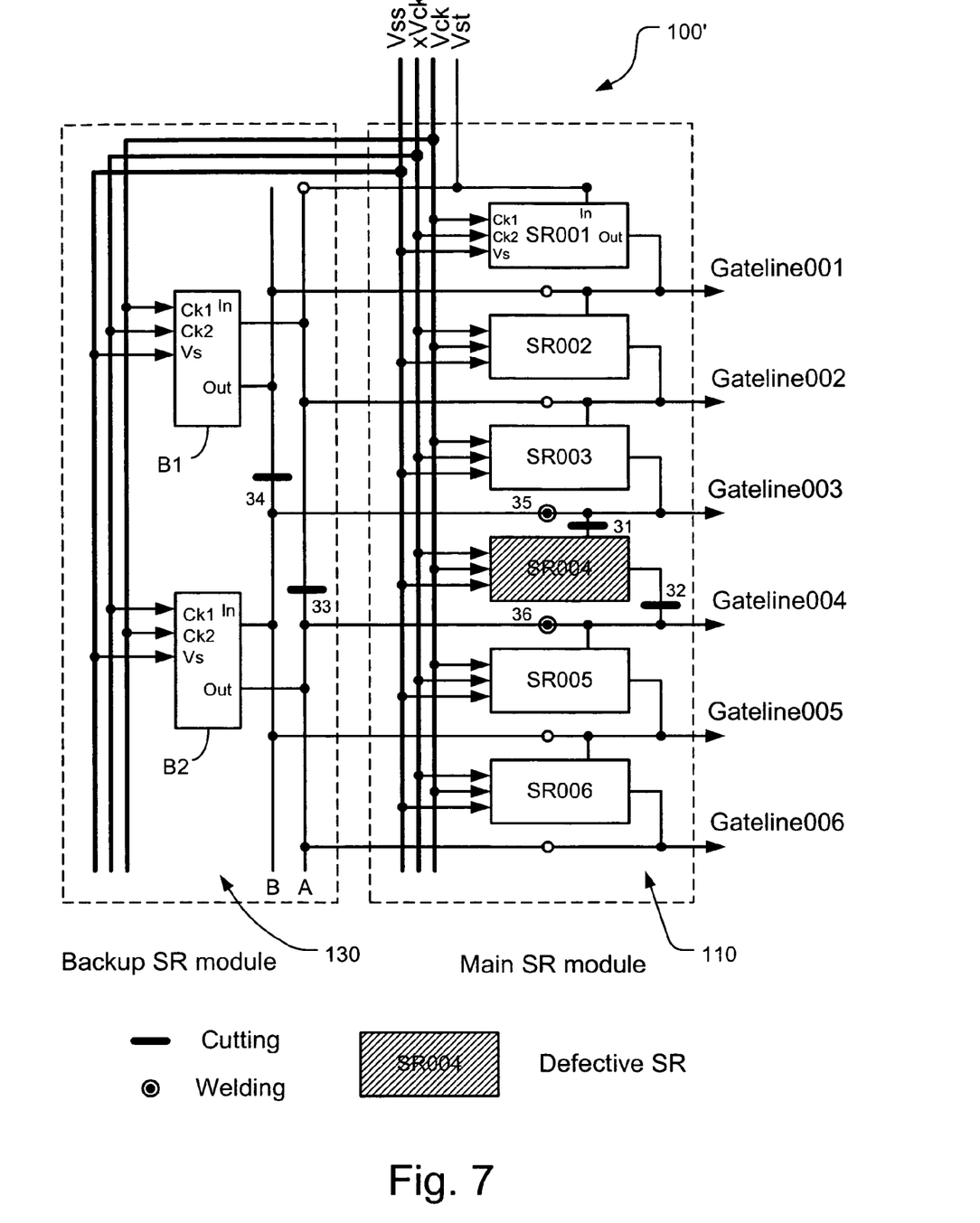
FIG. 7 is a circuit diagram showing a backup SR module and a main SR module, in which one even-numbered defective SR in main SR module is replaced by one SR in the backup SR module, according to the second embodiment of the invention.

If the defective SR is an even-numbered such as the fourth SR, SR004, as shown in FIG. 7, the input and the output of SR004 are disconnected from the cascade link by cutting at points 31 and 32, respectively. Meanwhile, the output of the preceding SR, SR003, is electrically connected to the input of R2 via bus line B, and input of the subsequent SR, SR005, is electrically connected to output of the R2 via bus line A. The electrical connections can be made by welding at points 35 and 36. Furthermore, the linkage between R1 and R2 is severed by cutting bus lines A and B at points 33 and 34.

As illustrated in FIGS. 5-7, two interconnected backup SRs can be used to replace one defective SR in the main module. In order to replace more detective SRs in the main module, it is possible to provide more interconnected backup SR pairs in the backup module. The input and output of each backup SR pair can be connected to a separate bus line pair. It is also possible that the input and output of two or more backup SR pairs share a bus line pair.

In sum, the present invention provides a gate-line driver for use in a display panel. The gate-line driver comprises:

a main shift register module having a plurality of N shift registers, where N is an integer greater than one, each register having an input and an output and wherein the shift registers are interconnected in a cascade link such that the input of a shift register k is connected to the output of a shift register k−1 with k<N; and a backup shift register module having at least a first backup shift register and a second shift register, wherein for each shift register i among the N shift registers, a normally open connectable link is positioned between the input of the shift register i and the input of the first backup shift register, and a normally open connectable link is positioned between the input of the shift register i+1 and the output of the first backup shift register, where i is a positive odd integer from 1 to N if N is odd and from 1 to N−1 if N is even; and for each shift register j among the N shift registers, a normally open connectable link is positioned between the input of the shift register j and the input of the second backup shift register, and a normally open connectable link is positioned between the input of the shift register j+1 and the output of the second backup shift register, where j is a positive odd integer from 2 to N if N is even and from 2 to N−1 if N is odd, so that if the shift register i is defective, the link between the input of the shift register i and the input of the first backup register is connected, the link between the input of the shift register i+1 and the output of the first backup register is connected, and the input and the output of the shift register i are disconnected from the cascade link, and if the shift register j is defective, the link between the input of the shift register j and the input of the second backup register is connected, the link between the input of the shift register j+1 and the output of the second backup register is connected, and the input and the output of the shift register j are disconnected from the cascade link.

The present invention also provides a method for repairing a gate-line driver for use in a display panel, the gate-line driver comprising a shift register module having a plurality of N shift registers, where N is an integer greater than one, each register having an input and an output and wherein the shift registers are interconnected in a cascade link such that the input of a shift register k is connected to the output of a shift register k−1 with k being a positive integer smaller than N. The method comprises the steps of:

1) interconnecting a backup shift register module to the shift register module, the backup shift register module having at least a first backup shift register and a second shift register, such that for each shift register i among the N shift registers, a normally open connectable link is positioned between the input of the shift register i and the input of the first backup shift register, and a normally open connectable link is positioned between the input of the shift register i+1 and the output of the first backup shift register, where i is a positive odd integer from 1 to N if N is odd and from 1 to N−1 if N is even; and for each shift register j among the N shift registers, a normally open connectable link is positioned between the input of the shift register j and the input of the second backup shift register, and a normally open connectable link is positioned between the input of the shift register j+1 and the output of the second backup shift register, where j is a positive odd integer from 2 to N if N is even and from 2 to N−1 if N is odd; and 2) if the shift register i is defective, connecting the link between the input of the shift register i and the input of the first backup register, connecting the link between the input of the shift register i+1 and the output of the first backup register, and disconnecting the input and the output of the shift register i from the cascade link, and if the shift register j is defective, connecting the link between the input of the shift register j and the input of the second backup register, connecting the link between the input of the shift register j+1 and the output of the second backup register, and disconnecting the input and the output of the shift register j from the cascade link.

Although the invention has been described with respect to one or more embodiments thereof, it will be understood by those skilled in the art that the foregoing and various other changes, omissions and deviations in the form and detail thereof may be made without departing from the scope of this invention.

What is claimed is:

1. A gateline driver for use in a display panel, comprising:
a main shift register module having a plurality of N shift registers, where N is an integer greater than one, each register having an input and an output and wherein the shift registers are interconnected in a cascade link such that the input of a shift register k is connected to the output of a shift register k−1 with k being a positive integer smaller than N; and
a backup shift register module having at least a first backup shift register and at least a second backup shift register, wherein
for each shift register i among the N shift registers,
a normally open connectable link is positioned between the input of the shift register i and the input of the first backup shift register, and
a normally open connectable link is positioned between the input of the shift register i+1 and the output of the first backup shift register, where i is a positive odd integer from 1 to N if N is odd and from 1 to N−1 if N is even; and
for each shift register j among the N shift registers,
a normally open connectable link is positioned between the input of the shift register i and the input of the second backup shift register, and
a normally open connectable link is positioned between the input of the shift register j+1 and the output of the second backup shift register, where j is a positive even integer from 2 to N if N is even and from 2 to N−1 if N is odd, so that
if the shift register i is defective, the link between the input of the shift register i and the input of the first backup register is connected, the link between the input of the shift register i+1 and the output of the first backup register is connected, and the input and the output of the shift register i are disconnected from the cascade link, and if the shift register j is defective, the link between the input of the shift register j and the input of the second backup register is connected, the link between the input of the shift register j+1 and the output of the second backup register is connected, and the input and the output of the shift register j are disconnected from the cascade link.

2. The gateline driver according to claim 1, wherein the backup shift register module comprises at least one odd-numbered shift register and one even-numbered shift-register, and wherein the first backup shift-register comprises the odd-numbered shift register and the second backup shift register comprises the even-numbered shift register.

3. The gateline driver according to claim 1, wherein the backup shift register module comprises a plurality of odd-numbered shift registers and a plurality of even-numbered shift registers, and wherein said at least a first backup shift register comprises said plurality of odd-numbered shift registers and said at least a second shift register comprises said plurality of even-numbered shift registers.

4. The gateline driver according to claim 2, further comprising:
  a control bus for providing a first clock signal (Vck) and a second clock signal (xVck), wherein the second clock signal has a phase 180° behind the phase of the first clock signal, wherein
  each of the first backup register and the shift register i has a first clock terminal (Ck1) operatively connected to the first clock signal and a second clock terminal (Ck2) operatively connected to the second clock signal, so that the first backup register can be used to replace the shift register i, and
  each of the second backup register and the shift register j has a first clock terminal (Ck1) operatively connected to the second clock signal and a second clock terminal (Ck2) operatively connected to the first clock signal, so that the second backup register can be used to replace the shift register j.

5. A method for repairing a gateline driver for use in a display panel, the gateline driver comprising a shift register module having a plurality of N shift registers, where N is an integer greater than one, each register having an input and an output and wherein the shift registers are interconnected in a cascade link such that the input of a shift register k is connected to the output of a shift register k−1 with k<N, said method comprising:
  1) interconnecting a backup shift register module to the shift register module, the backup shift register module having at least a first backup shift register and at least a second shift register, such that
  for each shift register i among the N shift registers,
    a normally open connectable link is positioned between the input of the shift register i and the input of the first backup shift register, and
    a normally open connectable link is positioned between the input of the shift register i+1 and the output of the first backup shift register, where i is a positive odd integer from 1 to N if N is odd and from 1 to N−1 if N is even; and for each shift register j among the N shift registers,
    a normally open connectable link is positioned between the input of the shift register j and the input of the second backup shift register, and
    a normally open connectable link is positioned between the input of the shift register j+1 and the output of the second backup shift register, where j is a positive even integer from 2 to N if N is even and from 2 to N−1 if N is odd; and 2) if the shift register i is defective, connecting the link between the input of the shift register i and the input of the first backup register, connecting the link between the input of the shift register i+1 and the output of the first backup register, and disconnecting the input and the output of the shift register i from the cascade link, and
  if the shift register j is defective, connecting the link between the input of the shift register j and the input of the second backup register, connecting the link between the input of the shift register j+1 and the output of the second backup register, and disconnecting the input and the output of the shift register j from the cascade link.

6. The method according to claim 5, wherein the backup shift register module comprises at least one odd-numbered shift register and one even-numbered shift-register, and wherein the first backup shift-register comprises the odd-numbered shift register and the second backup shift register comprises the even-numbered shift register.

7. The method according to claim 5, wherein the backup shift register module comprises a plurality of odd-numbered shift registers and a plurality of even-numbered shift registers, and wherein said at least a first backup shift register comprises said plurality of odd-numbered shift registers and said at least a second shift register comprises said plurality of even-numbered shift registers.

8. The method according to claim 6, wherein the gateline driver further comprises a control bus for providing a first clock signal (Vck) and a second clock signal (xVck), wherein the second clock signal has a phase 180° behind the phase of the first clock signal, and wherein
  each of the first backup register and the shift register i has a first clock terminal (Ck1) operatively connected to the first clock signal and a second clock terminal (Ck2) operatively connected to the second clock signal, so that the first backup register can be used to replace the shift register i, and
  each of the second backup register and the shift register j has a first clock terminal (Ck1) operatively connected to the second clock signal and a second clock terminal (Ck2) operatively connected to the first clock signal, so that the second backup register can be used to replace the shift register j.

9. A display panel comprising:
  a display module having a plurality of pixels arranged in an array, and a plurality of gate lines operatively to the pixels for providing control signals to the pixels; and
  a plurality of gateline drivers disposed in relationship with the display module, each of the gateline driver has a plurality of signal lines connected to some of the gate lines, at least some of the gateline drivers comprising:
  a main shift register module having a plurality of N shift registers, where N is an integer greater than one, each register having an input and an output, the output connected to one of the signal lines for providing a control signal to the connecting gate line, and wherein the shift registers are interconnected in a cascade link such that the input of a shift register k is connected to the output of a shift register k−1 with k being a positive integer smaller than N; and
  a backup shift register module having at least a first backup shift register and at least a second backup shift register, wherein
  for each shift register i among the N shift registers,
  a normally open connectable link is positioned between the input of the shift register i and the input of the first backup shift register, and a normally open connectable link is positioned between the input of the shift register i+1 and the output of the first backup shift register, where i is a positive odd integer from 1 to N if N is odd and from 1 to N−1 if N is even; and for each shift register j among the N shift registers, a normally open connectable link is positioned between the input of the shift register j and the input of the second backup shift register, and a normally open connectable link is positioned between the input of the shift register j+1 and the output of the second backup shift register, where j is a positive even integer from 2 to N if N is even and from 2 to N−1 if N is odd, so that if the shift register i is defective, the link between the input of the shift register i and the input of the first backup register is connected, the link between the input of the shift register i+1 and the output of the first backup register is connected, and the input and the output of the shift register i are disconnected from the cascade link, and if the shift register j is defective, the link between the input of the shift register j and the input of the second backup register is connected, the link between the input of the shift register j+1 and the output of the second backup register is connected, and the input and the output of the shift register j are disconnected from the cascade link.

10. The display panel according to claim 9, wherein the backup shift register module comprises at least one odd-numbered shift register and one even-numbered shift-register, and wherein the first backup shift-register comprises the odd-numbered shift register and the second backup shift register comprises the even-numbered shift register.

11. The display panel according to claim 9, wherein the backup shift register module comprises a plurality of odd-numbered shift registers and a plurality of even-numbered shift registers, and wherein said at least a first backup shift register comprises said plurality of odd-numbered shift registers and said at least a second shift register comprises said plurality of even-numbered shift registers.

12. The display panel according to claim 10, further comprising:

a control bus for providing a first clock signal (Vck) and a second clock signal (xVck), wherein the second clock signal has a phase 180° behind the phase of the first clock signal, wherein each of the first backup register and the shift register i has a first clock terminal (Ck1) operatively connected to the first clock signal and a second clock terminal (Ck2) operatively connected to the second clock signal, so that the first backup register can be used to replace the shift register i, and each of the second backup register and the shift register j has a first clock terminal (Ck1) operatively connected to the second clock signal and a second clock terminal (Ck2) operatively connected to the first clock signal, so that the second backup register can be used to replace the shift register j.

13. The display panel according to claim 9, wherein the gateline drivers are made of amorphous silicon.

14. The display panel according to claim 9, further comprising a substrate, wherein the pixels are fabricated on the substrate and the gateline drivers are also fabricated on the substrate.

* * * * *

UNITED STATES PATENT AND TRADEMARK OFFICE
CERTIFICATE OF CORRECTION

PATENT NO. : 7,636,077 B2 Page 1 of 1
APPLICATION NO. : 11/302917
DATED : December 22, 2009
INVENTOR(S) : Wei et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1042 days.

Signed and Sealed this

Twenty-first Day of December, 2010

David J. Kappos
*Director of the United States Patent and Trademark Office*